(12) United States Patent
Lee

(10) Patent No.: US 6,784,051 B2
(45) Date of Patent: Aug. 31, 2004

(54) METHOD FOR FABRICATING SEMICONDUCTOR DEVICE

(75) Inventor: Sung-Kwon Lee, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/330,295

(22) Filed: Dec. 30, 2002

(65) Prior Publication Data

US 2004/0058496 A1 Mar. 25, 2004

(30) Foreign Application Priority Data

Sep. 24, 2002 (KR) .................................. 10-2002-57755

(51) Int. Cl.⁷ .............................................. H01L 29/72
(52) U.S. Cl. .................. 438/244; 438/310; 438/311; 438/422; 257/295; 257/296
(58) Field of Search .................. 438/241, 310, 438/311, 422, 420; 257/295, 296

(56) References Cited

U.S. PATENT DOCUMENTS 6,118,145 A * 9/2000 Egawa ....................... 257/296

* cited by examiner

*Primary Examiner*—Edward Wojciechowicz
(74) *Attorney, Agent, or Firm*—Birch, Stewart, Kolasch & Birch, LLP

(57) ABSTRACT

The present invention provides a method for fabricating a semiconductor device capable of preventing a pattern at an edge area of a wafer from being lifted and acting as a particle source. The present invention includes the steps of: preparing a wafer having a first area and a second area, wherein the first area has lower topology than the second area; forming a target layer on the wafer; and patterning the target layer through a photolithography process so to form a number of first patterns in a line shape at the second area and to form a number of second patterns in a closed loop shape at the first area.

15 Claims, 8 Drawing Sheets

← EDGE OF WAFER

← EDGE OF WAFER

METHOD FOR FABRICATING SEMICONDUCTOR DEVICE

FIELD OF THE INVENTION

This nonprovisional application claims priority under 35 U.S.C. §119(a) on Patent Application No. 2002-57755 filed in KOREA on Sep. 24, 2002, which is herein incorporated by reference.

The present invention relates to a method for fabricating a semiconductor device; and, more particularly, to a method for fabricating a semiconductor device capable of preventing a lifting of the pattern at an edge area of a wafer.

DESCRIPTION OF RELATED ARTS

As a degree of integration of a semiconductor device has been progressively advanced, there also present several accompanying problems. A bad pattern at an edge of a wafer is one example of the problems.

Hereinafter, a lifting of a wiring line occurring at wafer edges will be described by providing a preferred embodiment in connection with a process for forming a bit line pattern.

FIGS. 1A to 1D are cross-sectional views illustrating a process for forming a bit line in accordance with the prior art.

An inter-layer insulating layer 13 is deposited on a wafer 11 providing various elements for constituting a semiconductor device including a word line (not shown) and an impurity junction 12. Herein, a word line insulating layer is another name for the inter-layer insulating layer 13. The inter-layer insulating layer 13 is selectively etched to form a contact hole exposing the impurity junction 12.

Continuously, a plug 14 for a bit line contact contacting to the impurity junction 12 exposed as burying the contact hole is formed. The plug 14 generally uses polysilicon. Currently, in addition to the polysilicon, a multi-stacked structure of tungsten and a barrier metal layer such as Ti/TiN is also increasingly used. In general, the Ti/TiN barrier metal layer is mainly used as a diffusion barrier layer.

The size of the contact hole becomes smaller close to the edge of the wafer 11 due to poor topology, and thus the width of the plug 14 also becomes thinner.

Next, a diffusion barrier layer 15 having a typical Ti/TiN structure for suppressing a reaction of a source gas with the plug 14 or the impurity junction 12 is formed on the plug 14. The source gas is employed when depositing a metal layer for a bit line, e.g., tungsten. On top of the diffusion barrier layer 15, a metal layer 16 for a bit line is formed by using a metal such as polysilicon and tungsten or a metal-alloy thin film such as tungsten nitride or tungsten silicide.

A buffer layer 17 is formed with the use of a an undoped silicate glass (USG) layer to reduce stress easily generated between the metal layer 16 and a subsequent nitride layer 18 used for a hard mask. Thereafter, the nitride layer 18 for a hard mask is deposited on the buffer layer 17 by applying a plasma enhanced chemical vapor deposition (PECVD) technique or a low pressure chemical vapor deposition (LPCVD) technique. FIG. 1A shows the state where the nitride layer 18 for a hard mask is deposited.

Referring to FIG. 1B, the nitride layer 18, the buffer layer 17, the metal layer 16 and the diffusion barrier layer 15 allocated at the edge area of the wafer are removed through the use of a wafer edge exposure (WEE) mask 19 in order to prevent a defect due to the metal layer 15 that can be remained at the edge area of the wafer in the course of a process for etching the nitride layer 18, the buffer layer 17, the metal layer 16 and the diffusion barrier layer 15 for forming a bit line. Herein, the above nitride layer 18, the buffer layer 17, the metal layer 16 and the diffusion barrier layer 15 are named bit line formation layers. At this time, the WEE mask 19 selectively opens a region, e.g., approximately 5 mm from the edge of the wafer for preparing an edge bead rinsing.

With reference to FIG. 1C, the bit line formation layers at the edge area of the wafer are removed, and then, the nitride layer 18, the buffer layer 17, the metal layer 16 and the diffusion barrier layer 15 are selectively etched by using a bit line etch mask so to form a bit line.

Referring to FIG. 1D, a nitride based material is deposited entirely on the above structure providing the bit line. An etch-back process is then performed to form a spacer 20 at lateral sides of the bit line.

An inter-layer insulating layer 21 is formed on the entire structure where the spacer is formed. Herein, a bit line insulating layer is another name for the inter-layer insulating layer 21. In particular, the inter-layer insulating layer 21 typically uses a USG layer formed at a low temperature. The inter-layer insulating layer 21 is thinly deposited at an area 22 opened doubly in the WEE mask and the bit line mask processes. That is, in case that a high density plasma oxide (HDP) having a good gap fill property among the USG layers formed at a low temperature is deposited as the inter-layer insulating layer 21, then, corners of the bit line close to the edge area of the wafer has a thinner deposition thickness based on deposition and etching mechanisms.

Subsequently, a chemical mechanical polishing (CMP) process for letting the inter-layer insulating layer 21 to be remained with a predetermined thickness on top of the nitride layer 18 is performed. At this time, a loss of a bit line pattern 23 near to the corners of the bit line is inevitable. Therefore, a lifting of the bit line pattern 23 occurs due to a thermal budget in a capacitor formation process carried out for fabricating a typical memory cell.

There have been many suggestions for improving the lifting of the bit line pattern. For instance, a bit line is formed at a point uniformly separated from the corners so as to be less affected by the loss of the inter-layer insulating layer 21 at the corners of the cell area when forming the bit line, or a material for the inter-layer insulating layer 21 is changed.

As shown in the lifting of the bit line pattern, a bad pattern at the edge of the wafer is caused by a global step difference due to a pattern density difference between a center and the edge of the wafer.

This global step difference becomes more severe because of a micronized pattern process. Thus, there have been researched on other approaches to cope with the global step difference.

The step difference between the center and the edge of the wafer becomes also severe due to the word line formation. As the pattern becomes micronized, topology at the edge of the wafer is degraded in more extents compared to the center of the wafer. Hence, a contact formation process for forming a bit line becomes more degraded at the edge of the wafer.

For instance, if a critical dimension (CD) of the contact hole in a 120 nm process is approximately 100 nm, the CD at the edge of the wafer is about 90 nm to 80 nm.

Since contacts at the center and the edge of the wafer have identical thickness but narrow width at the edge, an aspect ratio of the contact is inevitably larger at the edge of the wafer compared to the center of the wafer. Also, the lifting phenomenon at the edge of the wafer due to stress from a thermal budget and a material becomes even severe. Although the lifting phenomenon is not a major concern when the linewidth of the bit line is above about 100 nm, the lifting phenomenon becomes an issue in a process when the linewidth of the bit line is below about 100 nm.

In case that the pattern is collapsed or lifted at the edge area of the wafer, particles are generated. Accordingly, quality of a device is deteriorated and the particles penetrate into other normal wafer areas so as to induce a short circuit between electrodes.

The following will explain the lifting of the bit line at each area of the wafer.

In order to inspect the wafer, the wafer is classified with each die. It is observed that an area close to the center of the wafer and an area close to the edge of the wafer have different die shapes after completing an etching process for forming the bit line. Also, the contact hole size increases as being close to the center of the wafer. Thus, as close to the edge of the wafer, it is highly probable to have a poor contact hole pattern. Particularly, there are numerous lifted bit line patterns at the edge of the wafer.

Accordingly, when forming the pattern in a line shape as like the bit line, it is required to develop a new method for fabricating a semiconductor device capable of preventing a poor quality of the semiconductor device by suppressing occurrence of the lifting phenomenon at the edge area of the wafer so as to further prevent the lifted pattern from acting as a particle source by moving into-inner areas of the wafer.

SUMMARY OF THE INVENTION

It is, therefore, an object of the present invention to provide a method for fabricating a semiconductor device capable of preventing a pattern from being lifted at an edge area of a wafer and subsequently from acting as a particle source at inner sides of the wafer.

In accordance with an aspect of the present invention, there is provided a method for fabricating a semiconductor device, including the steps of: preparing a wafer having a first area and a second area, wherein the first area has lower topology than the second area; forming a target layer on the wafer; and patterning the target layer through a photolithography process so to form a number of first patterns in a line shape at the second area and to form a number of second patterns in a closed loop shape at the first area.

In accordance with another aspect of the present invention, there is also provided a method for fabricating a semiconductor device, including the steps of: forming a number of word lines on a wafer; forming an insulating layer on the wafer and the word line; forming a contact hole by selectively etching the insulating layer; forming a first conductive layer on the insulating layer including the contact hole;

forming a plug in the contact hole through a polishing of the first conductive layer, thereby obtaining a first area having lower topology than a second area; forming a second conductive layer on the wafer including the plug; patterning the second conductive layer through a photolithography process so to form a number of first patterns in a line shape at the first area and to form a number of dummy patterns in a closed loop shape at the second area; forming an insulating layer on the wafer including the first and second patterns; and planarizing the insulating layer.

When forming a pattern, particularly a line pattern such as a bit line, the line pattern at the edge of the wafer is not identically formed as being formed at areas other than the edge. Instead, a number of dummy patterns in a closed loop shape where a central portion is opened are formed with a uniform size by using an identical material of the line pattern formed at the central areas and performing a photolithography process at a certain area, preferably at an area expanded about 2.5 mm to 20 mm (ideally, around 17 mm) from the edge of the wafer. As a result, it is possible to prevent a poor quality of a semiconductor device occurring due to the pattern lifting at the edge area of the wafer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1A:
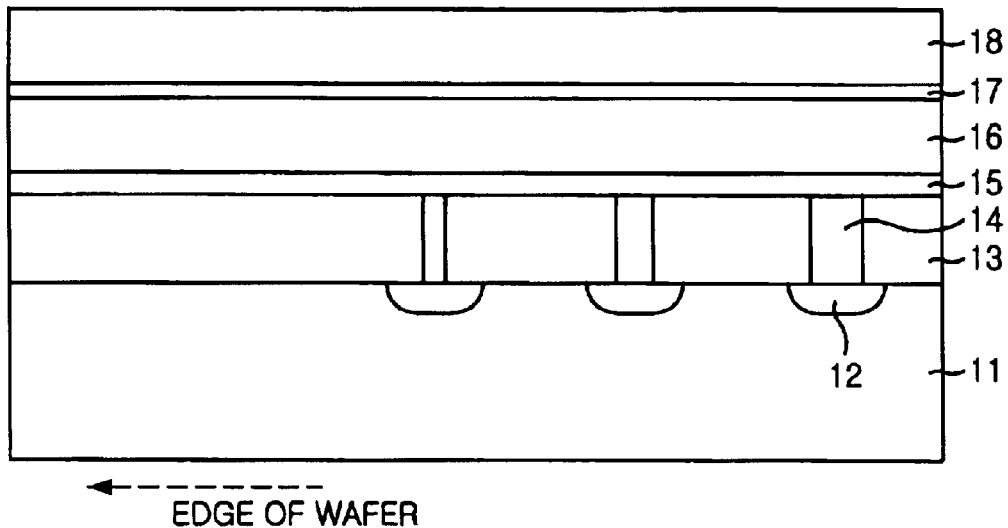
FIGS. 1A to 1D are cross-sectional views illustrating a method for forming a bit line in accordance with a prior art.
Figure 1B:
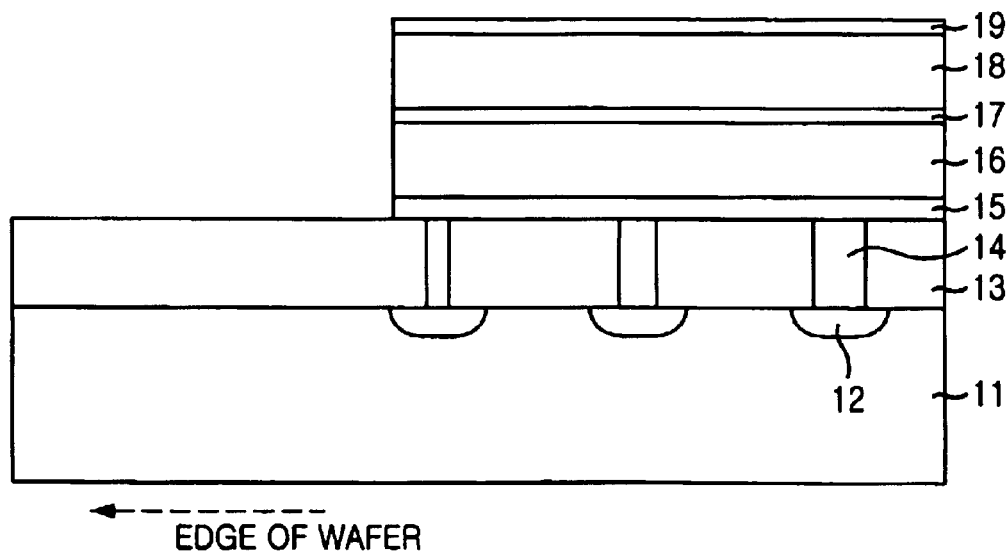
Figure 1C:
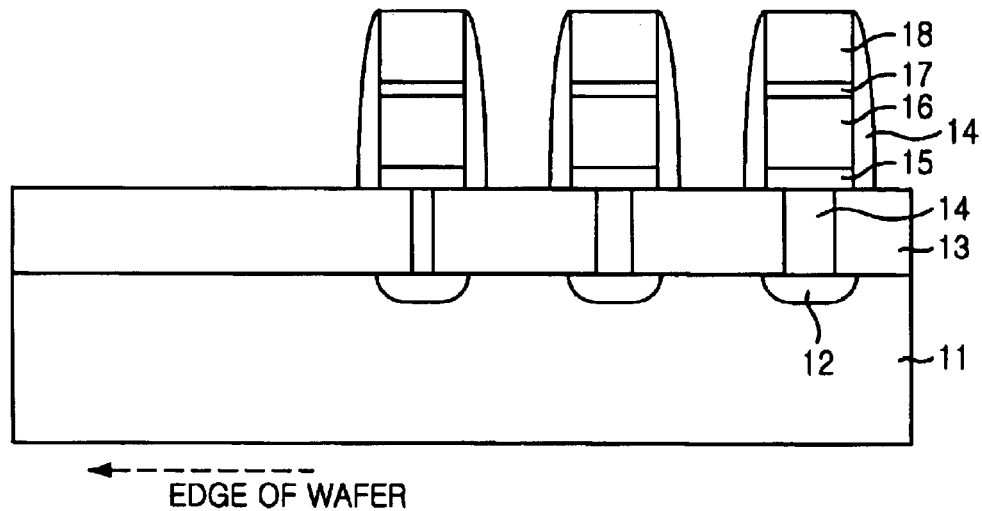
Figure 1D:
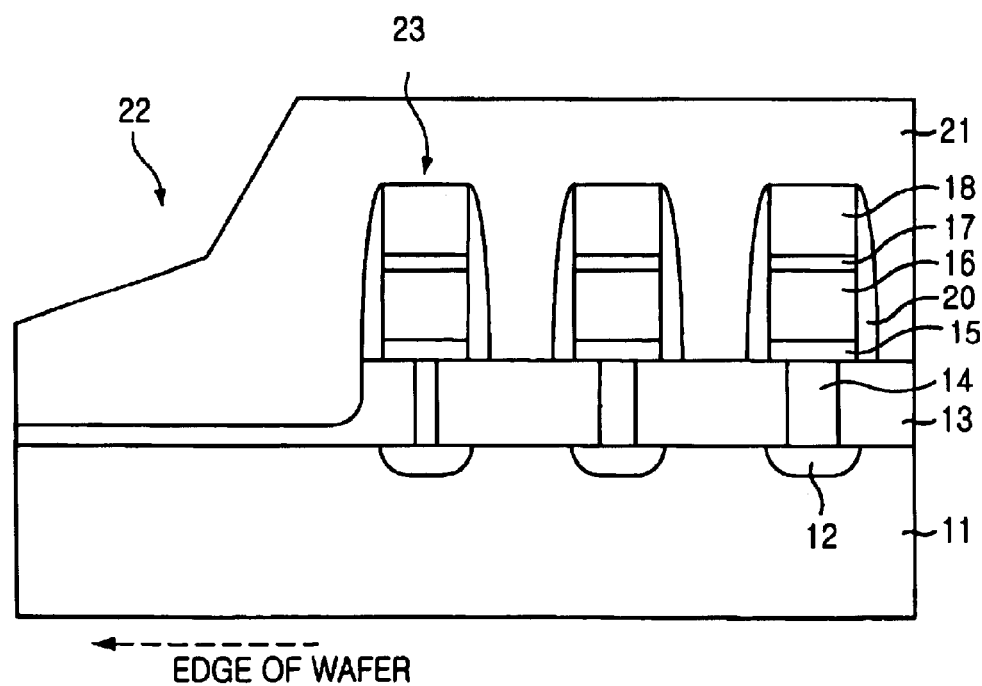
Figure 2:
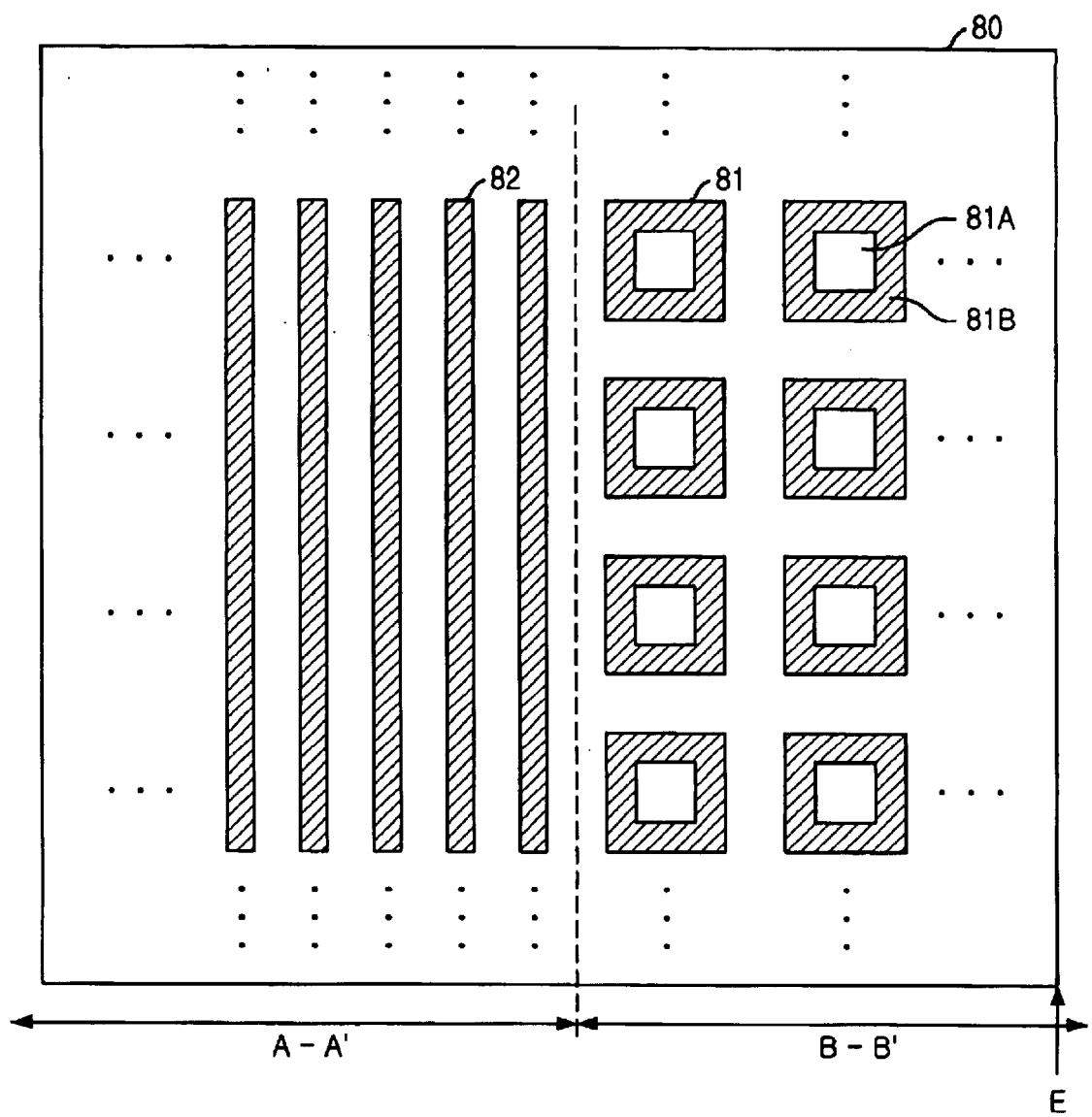
FIG. 2 is a plane view of a semiconductor device completed with a predetermined pattern formation process in accordance with a preferred embodiment of the present invention.

FIG. 2 shows a plan view of a semiconductor device completed with a predetermined pattern formation process in accordance with a preferred embodiment of the present invention.

Referring to FIG. 2, the semiconductor device in accordance with a preferred embodiment of the present invention includes a wafer 80 wherein an area B–B', an edge area, has a lower topology than an area A–A', which is an area other than the edge area, when a predetermined process is completed. A plurality of line patterns 82 are arrayed in the area A–A'. A plurality of dummy patterns 81 are arrayed in the area B–B'. The dummy patterns are formed in a shape of closed loop in which the central portion is opened in order to prevent a lifting of the line pattern 82 in the case where the line pattern 82 is formed at the edge area. The dummy pattern 81 is formed with the same photolithography process and material used for forming the line pattern 82.

Herein, the area B–B' of the wafer 80 is an area expanded up to about 2.5 mm to about 20 mm, preferably up to about 17 mm from the edge E of the wafer 80. The line pattern 82 can be a conductive pattern such as a bit line, a word line or a metal line or a nonconductive pattern in a line form.

The dummy pattern 81 includes an opened area 81A arrayed such that about 30% to about 50% of the area B–B' of the wafer 80 are opened, that is, an opened area 81A where the dummy pattern 81 is not formed occupies about 30% to about 50% of the total B–B' area and a dummy pattern formation area 81B is arrayed such that it occupies about 50% to about 70% of the total B–B' area. The reason for this arrangement is to prevent occurrence of a step difference due to a difference in topology of the two areas with a further consideration of a polishing selectivity of the area B–B' and the area A–A' when proceeding with a deposition process of a bit line insulating layer and a subsequent chemical mechanical polishing (CMP) process.

FIGS. 3A to 3F are plan views of variously shaped dummy patterns or masks.

Figure 3A:
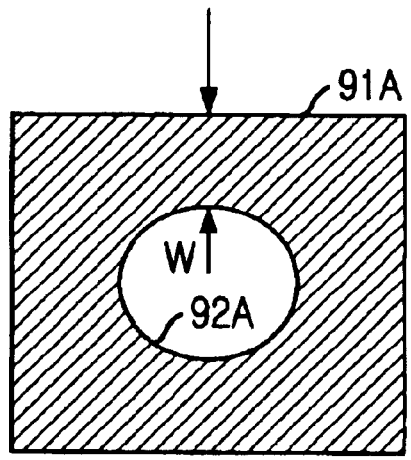
FIGS. 3A to 3F are plane views of variously shaped dummy patterns or masks.
Figure 3B:
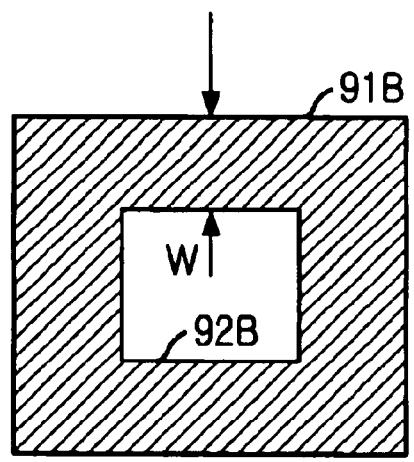
Figure 3C:
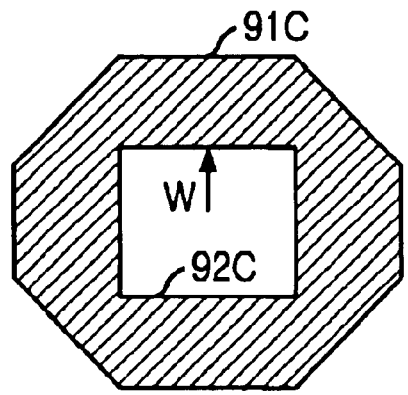
Figure 3D:
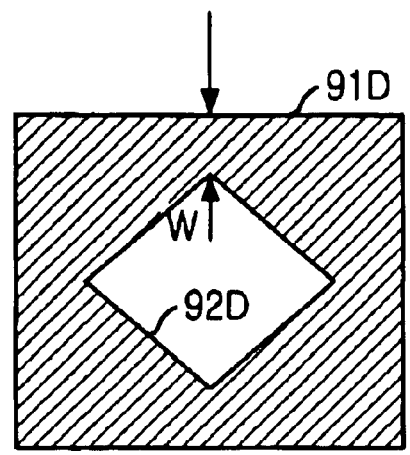
Figure 3E:
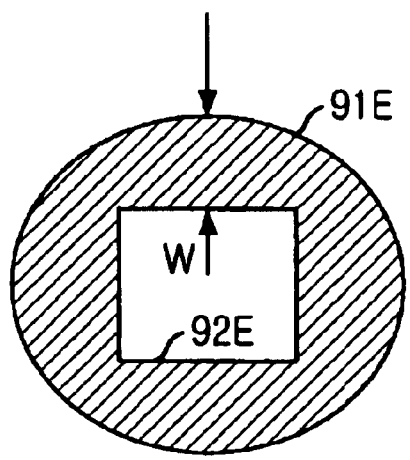
Figure 3F:
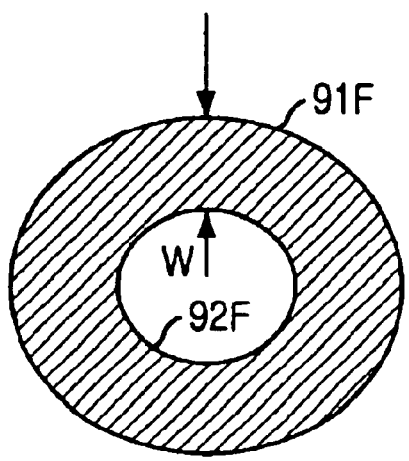

FIG. 3A shows a dummy pattern having a circular inner surface and a square-shaped outer surface. FIG. 3B shows another shape of a dummy pattern having a square-shaped inner surface and a square-shaped outer surface. A dummy pattern illustrated in FIG. 3C has a square-shaped inner surface and a hexagon-shaped outer surface. FIG. 3D shows a dummy pattern having a rhombus-shaped inner surface and a square-shaped outer surface. Also, FIG. 3E shows another type of a dummy pattern having a square-shaped inner surface and a circular outer surface. Both inner and outer surfaces of a dummy pattern shown in FIG. 3F have circular shapes.

As illustrated above, the inner and outer surfaces of the dummy pattern can have a circular or other possible polygonal shapes. However, each dummy pattern commonly has a the shape of a closed loop of in which the central portion thereof is opened. Hence, even if one side of a bottom portion of the pattern is lifted due to various types of stress during the pattern formation, it is still possible to reduce the probability of lifting at the other end of a bottom portion of the pattern, that is, the bottom portion of the pattern at the other side, since the central portion of the pattern is opened.

In Contrary to the closed loop configuration, if the central portion of the dummy pattern is not opened, that is, the two ends are connected in a straight direction, the probability of lifting occurring at the other end directly connected to the one end is substantially increased when the lifting occurs at the one end.

Each of the variously shaped dummy patterns in FIGS. 3A to 3F preferably has a space between the inner surface and the outer surface at the one end of the pattern. The width of the space ranges from about 2 μm to about 200 μm. The reason for specifically setting the width is to take into consideration a polishing selectivity in a subsequent chemical, mechanical polishing (CMP) process.

FIGS. 4A to 4D are cross-sectional views illustrating a process for forming a bit line in accordance with the preferred embodiment of the present invention. With reference to the drawings, more detailed descriptions of the process for forming the bit line will be provided.

An inter-layer insulating layer 103 is deposited on a wafer 101 providing various elements for constructing a semiconductor device such as a word line (not shown) and an impurity junction 102. Herein, a word line insulating layer is another name for the inter-layer insulating layer 103. The inter-layer insulating layer 103 is then selectively etched to form a contact hole (not shown) exposing the impurity junction 102.

Next, a conductive layer for a bit line contact plug 104 is formed for allowing a bit line to make & contact with the exposed impurity junction 102. The conductive layer is formed preferably with polysilicon and metal such as tungsten or stacked layers of polysilicon and tungsten. The conductive layer is proceeded with a CMP process so as to form a number of bit line contact plugs 104 in the contact hole.

There occurs a step difference between the two areas because a the density of the pattern in the edge area B–B' is lower than the area A–A'. As a result, the topology in the edge area B–B' becomes much lower due to an over polishing.

In accordance with the present invention, the edge area B–B' of the wafer 101 is an area expanded up to about 2.5 mm to about 20 mm from the edge of the wafer 101, and this area is where the dummy pattern is formed. The rest of the edge area is classified into the area A–A'. Patterns are formed with different shapes in these two areas.

Figure 4A:
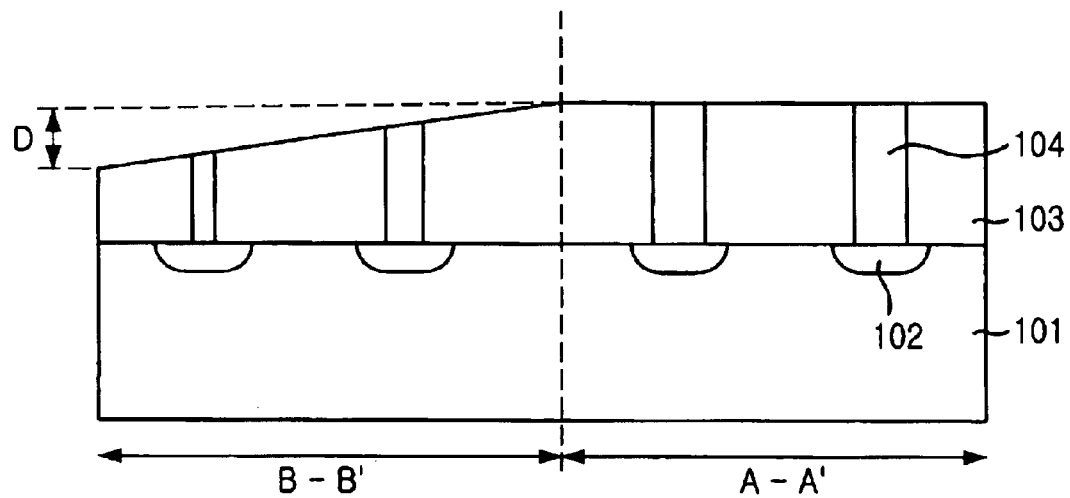
FIGS. 4A to 4D are cross-sectional views illustrating a process for forming a bit line in accordance with the preferred embodiment of the present invention.
Figure 4B:
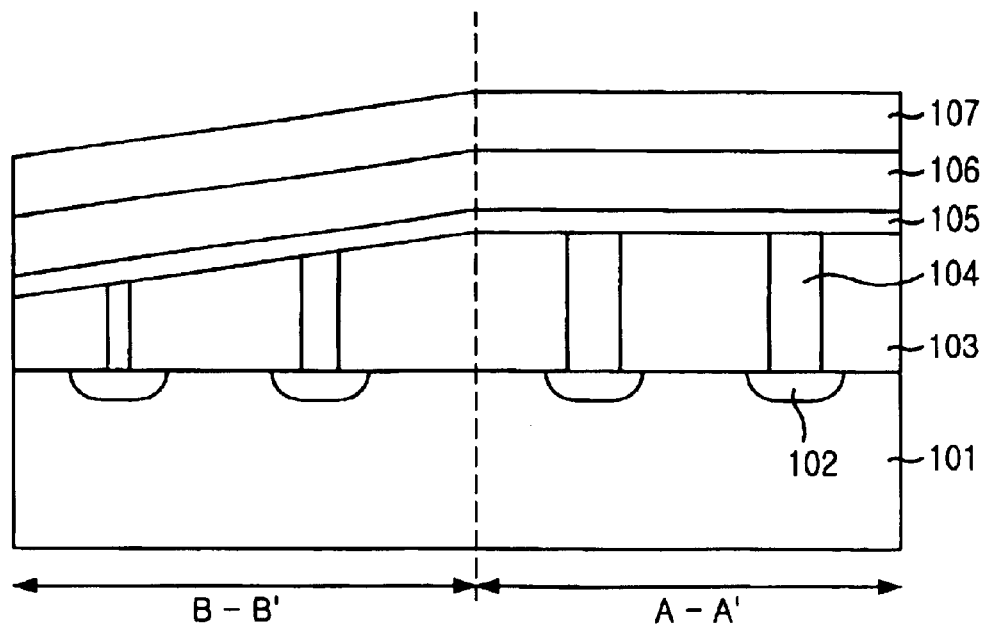

Referring to FIG. 4B, a diffusion barrier layer 105 having a Ti/TiN structure is formed on the bit line contact plug 104 in order to prevent a source gas used when forming a metal layer for a bit line, e.g., tungsten, from reacting with the bit line contact plug 104 or the impurity junction 102. Continuous with the formation of the diffusion barrier layer 105, a conductive layer 106 for a bit line is formed on the diffusion barrier layer 105 by using a metal thin film such as polysilicon and tungsten or a metal-alloy thin film such as tungsten nitride or tungsten suicide.

Then, an insulating layer 107 for a hard mask is deposited on the conductive layer 106 through the use of a nitride based thin film such as a silicon oxynitride layer or a silicon nitride layer in order to provide selectivity with an oxide layer generally used for the inter-layer insulating layer 103 and to prevent losses of the conductive layer 106 in an etching process for forming a storage node contact. FIG. 4B represents a state where the insulating layer 107 is formed.

In the mean time, it is possible to form a buffer layer between the conductive layer 106 and the insulating layer 107 with the use of undoped silicate glass (USG) to decrease stress easily generated between the insulating layer 107 and the conductive layer 106. As described the above, the insulating layer 107 is a nitride based layer. However, the buffer layer is not illustrated in FIG. 4B.

Next, a wafer edge exposure (WEE) mask is firstly employed to remove the insulating layer 107, the conductive layer 106 and the diffusion barrier layer 105 at the edge of the wafer 101. This is done to prevent the occurrence of a defect due to the conductive layer 106 that may remain at the edge of the wafer 101 while etching bit line formation layers for forming a bit line, that is, the insulating layer 107, the conductive layer 106 and the diffusion barrier layer 105. Subsequently, an edge bead rinsing (EBR) is conducted. However, detailed descriptions on the EBR will be omitted since the EBR is a known process.

Figure 4C:
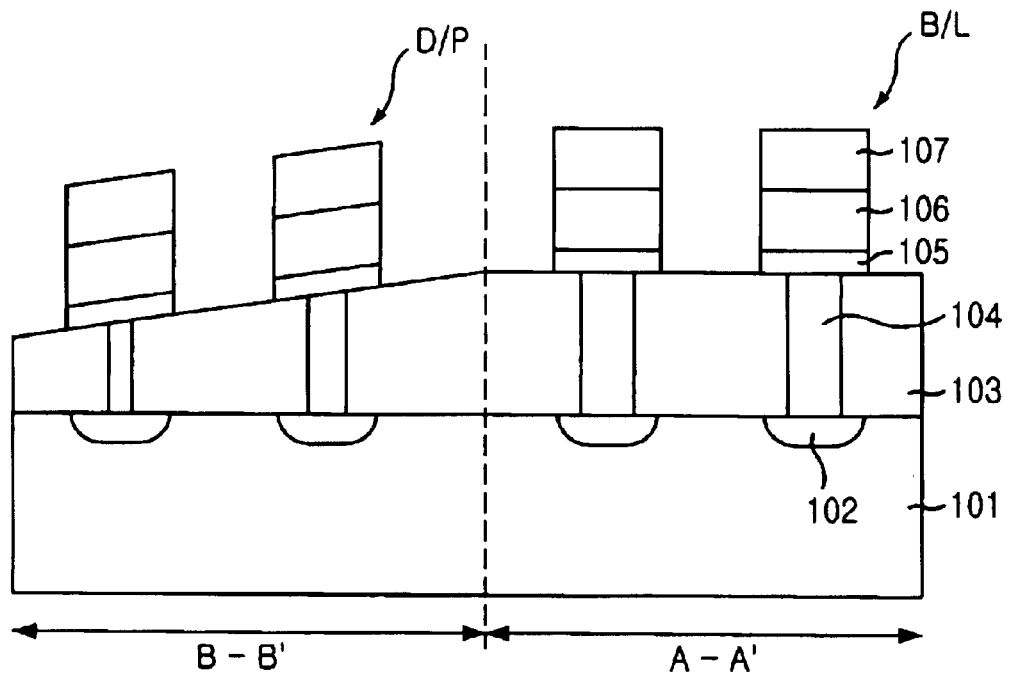

Referring to FIG. 4C, a photolithography process is carried out to selectively pattern the insulating layer 107, the conductive layer 106 and the diffusion barrier layer 105 so that a bit line B/L, which is a pattern in a line form, i.e., a line pattern, is formed at the area A–A' of the wafer 101. A number of dummy patterns D/P with a closed loop shape are formed at the edge area B–B' of the wafer 101. Herein, the closed loop shape has an opened central portion. Also, the reason for forming the dummy pattern at the edge area B–B' is to prevent the lifting of the bit line B/L in the case that where the line pattern such as the bit line is formed at the edge area B–B' of the wafer 101.

As described the above, the dummy pattern D/P includes an opened area arrayed in such a way that about 30% to about 50% of the area B–B' of the wafer 80 is opened, that is, an opened area where the dummy pattern D/P is not formed occupies about 30% to about 50% of the total B–B' area and a the dummy pattern formation area arrayed is such that it occupies about 50% to 70% of the total B–B' area. To meet this arrangement, it is possible to use a method for forming a positive pattern by letting about 30% to about 50% of the total area of the edge area of the wafer to be photo-exposed and removed or use a method for forming a negative pattern by not letting about 30% to about 50% of the total area of the edge area of the wafer to be photo-exposed and removed when proceeding the photolithography with the use of a mask having various shapes of the dummy patterns as shown in FIGS. 3A to 3F.

At this time, the dummy pattern D/P is able to suppress the lifting phenomenon by setting the dummy patterns to have various shapes.

Figure 4D:
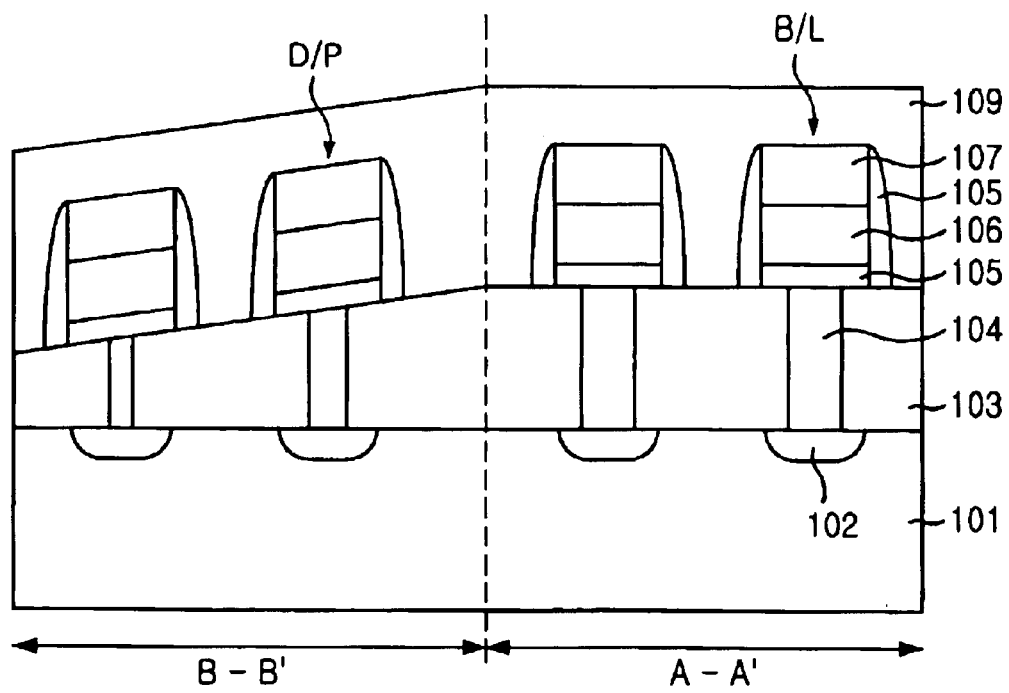

With reference to FIG. 4D, a nitride based material is deposited entirely on top of the structure including the bit lines B/L and the dummy patterns D/P. Thereafter, a spacer 108 is formed at lateral sides of the dummy pattern D/P and the bit line B/L by performing an etch-back process.

Next, an inter-layer insulating layer 109 is formed entirely on the structure including the spacer 108. Herein, the inter-layer insulating layer 109 is an oxide based layer, and a bit line insulating layer is another name for the inter-layer insulating layer 109. Another CMP process aimed for the inter-layer insulating layer 109 to be remained in a consistent thickness on top of the insulating layer 107 is performed to planarize the inter-layer insulating layer 109.

At this time, the dummy pattern D/P formation area is set to occupy about 50% to about 70% of the total area of the edge area B–B'. With this arrangement, it is possible to minimize the step difference occurring due to polishing selectivity between the edge area B–B' and the area A–A'.

When forming the line pattern such as a bit line, a certain area expanded from the edge of the wafer is classified into an edge area. In the edge area, a number of dummy patterns are formed through the use of the identical material and photolithography for forming the line pattern. At this time, the dummy pattern has a closed loop shape with an opened central portion. Hence, it is more advantageous of preventing a potential lifting that may occur when forming the line pattern at the edge area, and further preventing the lifted line pattern from penetrating into other areas of the wafer and acting as a particle source. It is also advantageous of suppressing a defect that may occur due to the lifting phenomenon, thereby ultimately improving yields of semiconductor devices.

Although the preferred embodiment of the present invention describes a case of forming a bit line as a line pattern, the line pattern can be also applicable to a conductive pattern such as a word line and a metal line. More broadly, it is still possible to apply the line pattern to any type of patterns in a line form.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
   preparing a wafer having a first area and a second area, wherein the first area has lower topology than the second area;
   forming a conductive layer on the wafer; and
   patterning the conductive layer through a photolithography process so to form a number of conductive patterns in a line shape at the second area and a number of dummy conductive patterns in a closed loop configuration at the first area,
   wherein the first area is an edge area of the wafer.

2. The method as recited in claim 1, wherein the first area is an area expanded up to about 2.5 mm to about 20 mm from the edge of the wafer.

3. The method as recited in claim 1, wherein the closed loop has an opening at the central portion thereof.

4. The method as recited in claim 1, wherein the first conductive pattern includes any one of a bit line, a word line or a metal line.

5. The method as recited in wherein, in the step of patterning the conductive layer, the conductive layer in the second area is removed by about 30% to about 50% of the total area of the second area.

6. The method as recited in claim 1, wherein the second conductive pattern has inner and outer surfaces, each in a circular or polygonal shape.

7. The method as recited in claim 6, wherein the second conductive pattern has a space between the inner surface and the outer surface, wherein width of the space ranges from about 2 μm to about 20 μm.

8. The method as recited in claim 1, wherein the step of forming the second pattern further comprises the steps of:
   forming an insulating layer on the wafer; and
   planarizing the insulating layer by applying a chemical mechanical polishing process to the insulating layer.

9. A method for fabricating a semiconductor device, comprising the steps of:
   forming a number of word lines on a wafer having a first area and a second area;
   forming an insulating layer on the wafer and the word line;
   forming a contact hole by selectively etching the insulating layer;
   forming a first conductive layer on the insulating layer including the contact hole;
   forming a plug in the contact hole through a polishing of the first conductive layer, thereby obtaining the first area having a lower topology than the second area;
   forming a second conductive layer on the wafer including the plug;
   patterning the second conductive layer through a photolithography process so to form a number of first patterns in a line shape at the first area and to form a number of dummy patterns in a closed loop shape at the second area;
   forming an insulating layer on the wafer including the first and second patterns; and
   planarizing the insulating layer.

10. The method as recited in claim 9, wherein the first area is an edge area of the wafer.

11. The method as recited in claim 10, wherein the first area is an area expanded up to about 2.5 mm to about 20 mm from the edge of the wafer.

12. The method as recited in claim 9, wherein the dummy pattern has an opening at central portion thereof.

13. The method as recited in claim 12, wherein, in the step of patterning the second conductive layer, the second conductive layer in the second area is removed by about 30% to about 50% of the total area of the second area.

14. The method as recited in claim 9, wherein the dummy pattern has inner and on outer surfaces each in a circular or polygonal shape.

15. The method as recited in claim 14, wherein the dummy pattern has a space between the inner surface and the outer surface, wherein with of the space ranges from about 2 μm to about 20 μm.

* * * * *